United States Patent
Gong et al.

(10) Patent No.: US 8,916,421 B2
(45) Date of Patent: Dec. 23, 2014

(54) SEMICONDUCTOR DEVICE PACKAGING HAVING PRE-ENCAPSULATION THROUGH VIA FORMATION USING LEAD FRAMES WITH ATTACHED SIGNAL CONDUITS

(75) Inventors: Zhiwei Gong, Chandler, AZ (US); Navjot Chhabra, Austin, TX (US); Glenn G. Daves, Austin, TX (US); Scott M. Hayes, Chandler, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 13/222,148

(22) Filed: Aug. 31, 2011

(65) Prior Publication Data
US 2013/0049182 A1    Feb. 28, 2013

(51) Int. Cl.
*H01L 21/70* (2006.01)
*H01L 21/48* (2006.01)
*H01L 23/538* (2006.01)
*H01L 23/00* (2006.01)
*H01L 21/56* (2006.01)

(52) U.S. Cl.
CPC .......... *H01L 21/486* (2013.01); *H01L 23/5389* (2013.01); *H01L 24/19* (2013.01); *H01L 24/20* (2013.01); *H01L 24/97* (2013.01); *H01L 2924/01012* (2013.01); *H01L 2924/01029* (2013.01); *H01L 2224/12105* (2013.01); *H01L 21/568* (2013.01); *H01L 2224/97* (2013.01)
USPC ........... 438/123; 438/584; 438/127; 438/611; 257/676

(58) Field of Classification Search
USPC ......................................... 438/127, 584, 611
See application file for complete search history.

(56) References Cited

U.S. PATENT DOCUMENTS

| | | | |
|---|---|---|---|
| 3,865,458 A * | 2/1975 | Pauza et al. ................... | 439/345 |
| 5,710,063 A | 1/1998 | Forehand et al. | |
| 5,886,401 A | 3/1999 | Liu | |
| 6,081,989 A | 7/2000 | Pluymers et al. | |
| 6,271,057 B1 | 8/2001 | Lee et al. | |
| 6,372,619 B1 | 4/2002 | Huang et al. | |
| 6,743,660 B2 | 6/2004 | Lee et al. | |
| 6,872,591 B1 | 3/2005 | Wang et al. | |
| 6,876,066 B2 * | 4/2005 | Fee et al. ...................... | 257/666 |
| 7,030,469 B2 | 4/2006 | Mahadevan et al. | |
| 7,071,554 B2 | 7/2006 | Hussein et al. | |
| 7,078,788 B2 | 7/2006 | Vu et al. | |
| 7,495,319 B2 * | 2/2009 | Fukuda et al. ................ | 257/666 |

(Continued)

OTHER PUBLICATIONS

U.S. Appl. No. 13/222,150, Inventor Zhiwei Gong, "Semiconductor Device Packaging Having Pre-Encapsulation Through VIA Formation", filed Aug. 31, 2011, Office Action—Restriction, mailed Sep. 20, 2012.

(Continued)

*Primary Examiner* — Chuong A Luu
*Assistant Examiner* — Jaehwan Oh
(74) *Attorney, Agent, or Firm* — Jonathan N. Geld

(57) ABSTRACT

A semiconductor device package having pre-formed and placed through vias and a process for making such a package is provided. One or more signal conduits are coupled to a lead frame that is subsequently embedded in an encapsulated semiconductor device package. The free end of signal conduits is exposed while the other end remains coupled to a lead frame. The signal conduits are then used as through package vias, providing signal-bearing pathways between interconnects or contacts on the bottom and top of the package and the leads.

17 Claims, 5 Drawing Sheets

(56) References Cited

U.S. PATENT DOCUMENTS

| | | | |
|---|---|---|---|
| 7,556,983 B2* | 7/2009 | Kurita | 438/108 |
| 7,633,765 B1 | 12/2009 | Scanlan et al. | |
| 7,671,457 B1 | 3/2010 | Hiner et al. | |
| 7,671,459 B2 | 3/2010 | Corisis et al. | |
| 7,678,612 B2* | 3/2010 | Fujii et al. | 438/118 |
| 7,704,800 B2 | 4/2010 | Zhang | |
| 7,799,603 B2 | 9/2010 | Tsai et al. | |
| 7,812,457 B2 | 10/2010 | Kurita | |
| 7,838,420 B2 | 11/2010 | Tang et al. | |
| 7,842,542 B2* | 11/2010 | Shim et al. | 438/106 |
| 7,863,098 B2* | 1/2011 | Lange et al. | 438/108 |
| 7,863,729 B2* | 1/2011 | Hsu et al. | 257/700 |
| 7,875,505 B2* | 1/2011 | Wang | 438/123 |
| 7,892,962 B2 | 2/2011 | Su | |
| 7,989,950 B2 | 8/2011 | Park et al. | |
| 8,017,452 B2* | 9/2011 | Ishihara et al. | 438/127 |
| 8,021,930 B2* | 9/2011 | Pagaila | 438/124 |
| 8,039,304 B2* | 10/2011 | Pagaila | 438/107 |
| 8,110,911 B2* | 2/2012 | Ishihara et al. | 257/687 |
| 8,120,149 B2* | 2/2012 | Camacho et al. | 257/676 |
| 8,227,338 B1* | 7/2012 | Scanlan et al. | 438/637 |
| 8,227,927 B2 | 7/2012 | Chen et al. | |
| 8,242,601 B2 | 8/2012 | Chou et al. | |
| 8,273,660 B2 | 9/2012 | Park et al. | |
| 8,338,922 B1 | 12/2012 | Sirinorakul et al. | |
| 8,383,950 B1 | 2/2013 | Huemoeller et al. | |
| 2003/0090883 A1* | 5/2003 | Asahi et al. | 361/761 |
| 2004/0195691 A1 | 10/2004 | Moriyasu et al. | 257/758 |
| 2005/0012186 A1* | 1/2005 | Zimmerman | 257/666 |
| 2005/0029642 A1* | 2/2005 | Takaya et al. | 257/678 |
| 2005/0247665 A1* | 11/2005 | Oi et al. | 216/13 |
| 2006/0087044 A1* | 4/2006 | Goller | 257/783 |
| 2006/0121718 A1* | 6/2006 | Machida et al. | 438/612 |
| 2006/0291029 A1 | 12/2006 | Lin et al. | |
| 2007/0212865 A1 | 9/2007 | Amrine et al. | |
| 2008/0224283 A1* | 9/2008 | Pu et al. | 257/673 |
| 2009/0050994 A1* | 2/2009 | Ishihara et al. | 257/432 |
| 2009/0057849 A1 | 3/2009 | Tang et al. | |
| 2009/0130801 A1 | 5/2009 | Fukuda et al. | |
| 2010/0006994 A1* | 1/2010 | Shim et al. | 257/676 |
| 2010/0127386 A1 | 5/2010 | Meyer-Berg | |
| 2010/0200970 A1 | 8/2010 | Zhang | |
| 2011/0037154 A1 | 2/2011 | Shim et al. | |
| 2011/0065241 A1* | 3/2011 | Lin et al. | 438/118 |
| 2011/0163435 A1* | 7/2011 | Tsukamoto et al. | 257/676 |
| 2012/0168884 A1* | 7/2012 | Yao et al. | 257/415 |
| 2012/0181874 A1* | 7/2012 | Willkofer et al. | 307/104 |

OTHER PUBLICATIONS

Office Action mailed Feb. 15, 2013 in U.S. Appl. No. 13/222,143.
Office Action mailed Apr. 26, 2013 in U.S. Appl. No. 13/222,150.
U.S. Appl. No. 13/222,150, Inventor Zhiwei Gong, "Semiconductor Device Packaging Having Pre-Encapsulation Through VIA Formation", filed Aug. 31, 2011, Office Action—Rejection, mailed Dec. 6, 2012.
U.S. Appl. No. 13/299,564, Inventor Zhiwei Gong, "Semiconductor Device Packaging Having Pre-Encapsulation Through VIA Formation", filed Nov. 18, 2011, Office Action—Rejection, mailed Dec. 19, 2012.
Office Action mailed May 31, 2013 in U.S. Appl. No. 13/299,564.
Notice of Allowance mailed Jul. 10, 2013 in U.S. Appl. No. 13/222,150.
Office Action mailed Jun. 6, 2013 in U.S. Appl. No. 13/222,143.
Notice of Allowance mailed Jul. 31, 2013 in U.S. Appl. No. 13/299,564.
Office Action mailed Jan. 3, 2014 in U.S. Appl. No. 13/222,143.
Office Action mailed Mar. 20, 2014 in U.S. Appl. No. 13/222,143.
Office Action mailed Sep. 13, 2013 in U.S. Appl. No. 13/222,150.
U.S. Appl. No. 13/222,150, Inventor Zhiwei Gong, "Semiconductor Device Packaging Having Pre-Encapsulation Through VIA Formation", filed Aug. 31, 2011, Office Action—Final Rejection, mailed Sep. 29, 2014.

* cited by examiner

SEMICONDUCTOR DEVICE PACKAGING HAVING PRE-ENCAPSULATION THROUGH VIA FORMATION USING LEAD FRAMES WITH ATTACHED SIGNAL CONDUITS

CROSS-REFERENCE TO RELATED APPLICATION(S)

This application is related to U.S. patent application Ser. No. 13/222143, filed on even date, entitled "SEMICONDUCTOR DEVICE PACKAGING HAVING PRE-ENCAPSULATION THROUGH VIA FORMATION USING DROP-IN SIGNAL CONDUITS," naming Zhiwei Gong, Navjot Chhabra, Glenn G. Daves, Scott M. Hayes, Douglas G. Mitchell, and Jason R. Wright as inventors, and assigned to the current assignee hereof, and U.S. patent application Ser. No. 13/222150, filed on even date, entitled "SEMICONDUCTOR DEVICE PACKAGING HAVING PRE-ENCAPSULATION THROUGH VIA FORMATION," naming Zhiwei Gong, Navjot Chhabra, Glenn G. Daves, and Scott M. Hayes as inventors, and assigned to the current assignee hereof.

BACKGROUND

1. Field

This disclosure relates generally to semiconductor device packaging, and more specifically, to providing through-package vias in an encapsulated device package by using pre-formed signal conduits, such as conductive pillars and optical waveguides.

2. Related Art

Semiconductor and other types of electronic devices are often encapsulated wholly or partly in resin to provide environmental protection and facilitate external connection to the devices. Subsequent to encapsulation, interconnect structures can be built up on one or both sides of the encapsulated devices. For packages having electrical contacts on both top and bottom surfaces (e.g., a double-sided buildup), through-vias are often made to provide contacts between bottom side and top side interconnect structures. Traditionally, through package vias are made after encapsulation using a drilling and filling/metallization process that includes steps for via drill, via fill/metallization, polish and taping, and so on. This process of post-encapsulation via formation introduces complexities to the manufacturing process that have a variety of manufacturing and reliability challenges (e.g., consistent integrity of the through via and reliable connection to the interface). Further, costs associated with materials, processes and additional tooling to generate the through vias can be high.

It is therefore desired to have a process for creation of through package vias by utilizing existing tools for manufacturing encapsulated packages. It is further desired that the mechanism for providing through vias allows for incorporation of the through vias with an embedded lead frame used in, for example, a fan-out wafer level packaging (WLP) and redistributed chip packaging (RCP).

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

A semiconductor device package having pre-formed through vias with a lead frame embedded in the package and a process for making such a package is provided. A lead frame is formed in a manner in which one or more conductive signal conduits (e.g., conductive pillars) are attached to the lead frame or are formed as a part of the lead frame. The lead frame along with the signal conduits is embedded in an encapsulated semiconductor device package. The ends of the signal conduits are exposed and the signal conduits can then be used as through vias, providing signal-bearing pathways between interconnects or contacts on the bottom and top of the package, with the leads of the lead frame. Lead frames can be provided in a variety of geometries and materials depending upon the nature of the application.

For convenience of explanation, and not intended to be limiting, the present invention is described for semiconductor devices, but persons of skill in the art will understand that the present invention applies to any type of electronic or optoelectronic device that is substantially planar. Accordingly, such other types of devices including the non-limiting examples given below, are intended to be included in the terms "device," "semiconductor device," and "integrated circuit" whether singular or plural, and the terms "device," "die,"

and "chip" are intended to be substantially equivalent. Non-limiting examples of suitable devices are semiconductor integrated circuits, individual semiconductor devices, piezoelectric devices, solid-state filters, magnetic tunneling structures, integrated passive devices such as capacitors, resistors and inductors, and combinations and a raise of any and all of these types of devices and elements. Further, embodiments of the present invention do not depend upon the types of die or chips being used nor the materials of which they are constructed provided that such materials withstand the encapsulation process.

The following detailed description is merely exemplary in nature and is not intended to limit the invention or the application and uses of the invention. Furthermore, there is no intention to be bound by any expressed or implied theory presented in the preceding technical field, background, brief summary or the following detailed description. In some examples, the signal conduit for passing a signal from one side of the device package to another is described as a conductive via. It should be recognized that such examples are not intended to limit embodiments of the present invention to electrically conductive materials, as the signal conduit can include additional materials such as waveguide for passing optical signals.

Figure 1:
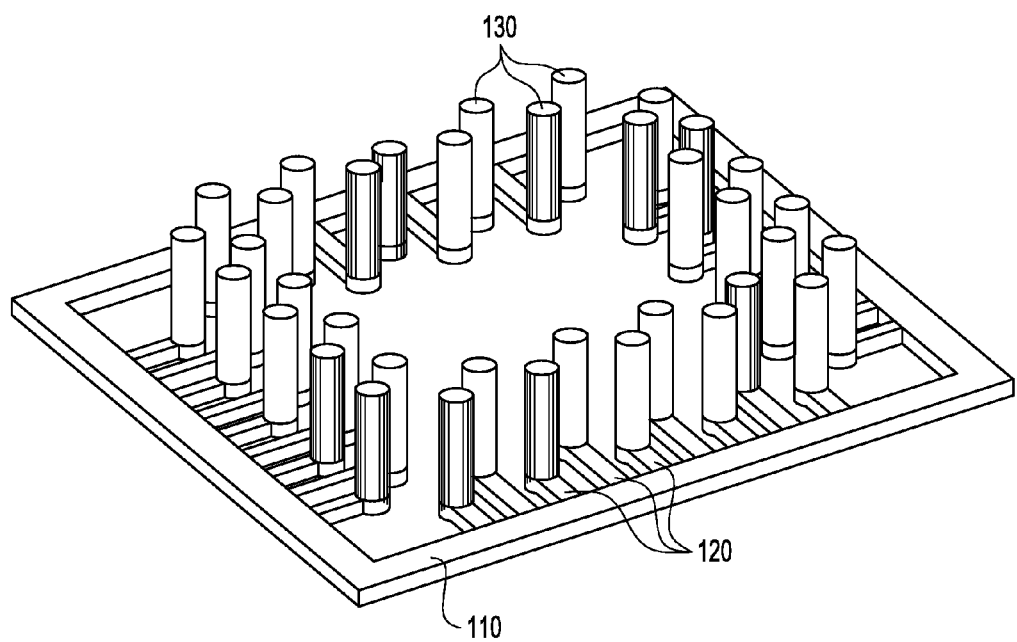
FIG. 1 is a simplified block diagram illustrating a lead frame assembly having signal conduits, in accord with one embodiment of the present invention.

FIG. 1 is a simplified block diagram illustrating a lead frame assembly having signal conduits, in accord with one embodiment of the present invention. A portion of frame 110 with leads 120 is shown having a set of conductive signal conduits 130 attached to the ends of each lead 120 (e.g., staggered terminal ends). It should be understood that 100 is one cell of a larger, repeating assembly used to fabricate a larger panel (e.g., a grid). Frame 110 and leads 120 can be made from a variety of materials standard in the art of semiconductor packaging and suitable to the application (e.g., copper, iron, zinc, nickel, magnesium, and the like, and alloys made therefrom). A typical process for forming frame 110 with leads 120 is by a photoresist and etch process. Alternatively, frame 110 with leads 120 can be formed using a stamping process.

Signal conduits 130 can be made from any material suitable to the application. For example, conductive signal conduits can be made from a variety of electrically conductive materials including, for example, copper, gold, aluminum, tungsten, and alloys thereof, doped materials (e.g., phosphorus, boron-doped polysilicon), super-conducting materials and ceramics (e.g., copper oxide materials (such as $HgBa_2Ca_2Cu_3O_x$, and $Bi_2Sr_2Ca_2Cu_3O_{10}$(BSCCO)), iron-based materials (such as SmFeAs(O,F)) and other metallic-based materials (such as $Nb_3Sn$)), the choice of which is dependent upon the nature of the application. The signal conduits 130 can also be made of more than one type of material depending on the process to create the conduits, lead frame assembly and particular package structures.

A variety of methods can be used to incorporate signal conduits 130 onto lead frame assembly 100. For example, leads 120 can be formed in a fashion that allows for the ends to be bent at a 90° angle to form the signal conduits. The bending process can be a secondary step to stamping the lead frame. Other methods can be used for attaching pre-formed signal conduits 130 to the leads 120. Examples of such attachment methods can be drop and reflow of the copper columns, or a solder ball drop and reflow by which the signal conduits are attached to the leads. Alternatively, lead frame assembly 100 can be formed from either a stack of lead frame blanks or a single thick lead frame blank which is subjected to a selective etch that forms not only frame 110 and leads 120 but also signal conduits 130. Another alternative is to press fit signal conduits 130 into holes at the appropriate locations on leads 120, thereby fastening the signal conduits to associated leads in a mechanical locking process.

Figure 2:
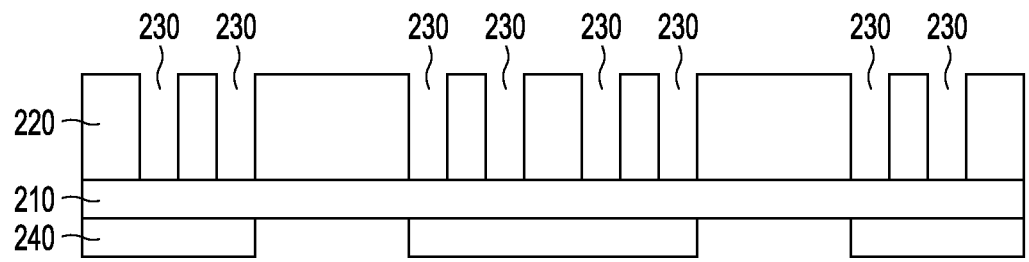
FIG. 2 is a simplified block diagram illustrating a plating process for forming electrically-conductive signal conduits on a lead frame, in accord with one embodiment of the present invention.

FIG. 2 is a simplified block diagram illustrating a plating process for forming electrically-conductive signal conduits on a lead frame, in accord with one embodiment of the present invention. FIG. 2 is a cross sectional view of a portion of the frame assembly structure at a stage of processing. Frame material 210 is provided and a photoresist layer 220 is deposited on the frame material. The photoresist is further patterned through standard techniques to form columnar holes 230 in which the signal conduits will be formed. In addition, photoresist or other types of dry film lamination layers 240 can be applied to protect areas of frame material 210 during subsequent processing. A thickness of photoresist layer 220 should be sufficient to form signal conduits of a desired height. In typical applications, it can be desirable to have conductive vias of 100 μm to 2 mm, depending upon the nature of the application.

It should be noted that at this stage frame material 210 can either be a blank or leads 120 can have already been formed. If leads 120 have not been formed, then subsequent etching processes can be used to form the leads after or concurrent with formation of the signal conduits.

Figure 3:
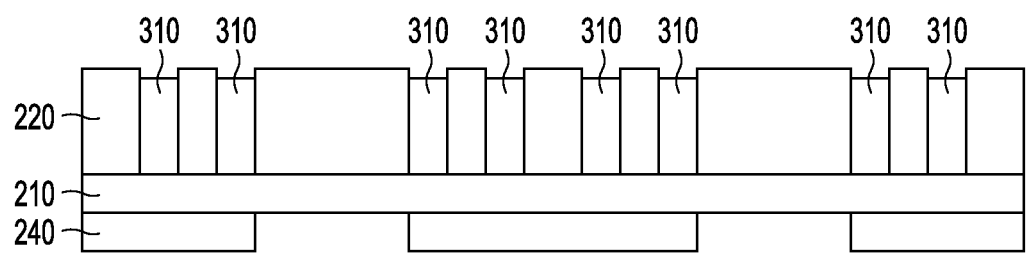
FIG. 3 is a simplified block diagram illustrating the cross sectional view of the device assembly structure at a later stage in processing, according to an embodiment of the present invention.

FIG. 3 is a simplified block diagram illustrating the cross sectional view of the device assembly structure at a later stage in processing, according to an embodiment of the present invention. Conductive signal conduits are formed by applying a plating layer 310 that forms the signal conduits in holes 230. Plating layer 310 can include generally any conductive material, such as, but not limited to, aluminum, copper, tantalum, titanium, tungsten, or any metal alloy, nitride or silicide thereof.

Figure 4:
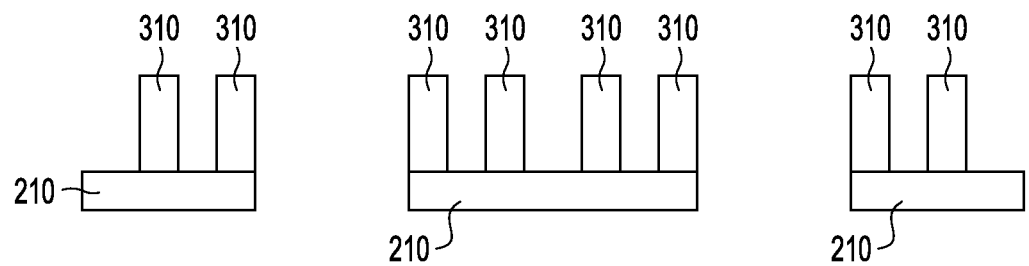
FIG. 4 is a simplified block diagram illustrating the cross sectional view of the device assembly structure at a later stage in processing, according to an embodiment of the present invention.

FIG. 4 is a simplified block diagram illustrating the cross sectional view of the device assembly structure at a later stage in processing, according to an embodiment of the present invention. At this stage, frame material 210 has been formed using an etching process to provide desired geometries, leads, and the like. Subsequent to etching, a photoresist and/or dry film strip process is performed to remove the photoresist and/or dry film. Subsequent to stripping, frame material 210 (as formed during etching) and signal conduits 310 (as formed from the plating layer) remain. The frame assembly illustrated in FIG. 4 as a cross-section can resemble frame assembly 100 illustrated in FIG. 1. Subsequent processing can now include associating the frame assembly with various device die in encapsulation process.

It should be understood that the geometries and configurations provided herein are made by way of example and are not intended to limit the nature or applications of embodiments of the present invention.

Figure 5:
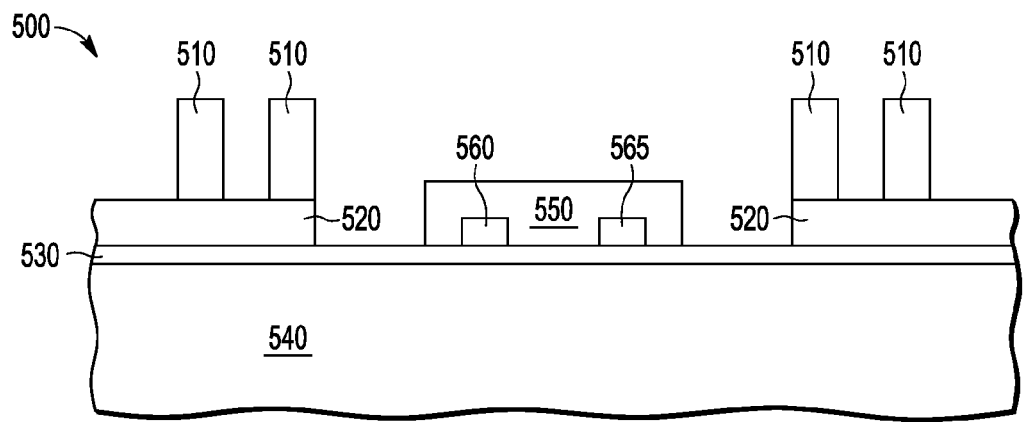
FIG. 5 is a simplified block diagram illustrating a cross-sectional view of a device structure at a stage in one example of processing, according to an embodiment of the present invention.

FIG. 5 is a simplified block diagram illustrating a cross-sectional view of a device structure 500 at a stage in one example of processing, according to an embodiment of the present invention. Signal conduits 510 are attached to a lead frame 520 and are placed on an adhesive tape 530 on a carrier 540. The signal conduits and frame configuration can be the same as that discussed above in FIGS. 1 and 4. Tape 530 can be of a standard type used in semiconductor packaging processing including, for example, a double-sided polyimide sticky tape having a silicone adhesive on both sides. The adhesive layer should be of the type that can withstand the packaging processing without becoming brittle or permanently fixed in place, since at a later point in processing the tape will be separated from the package. In addition to the signal conduit/holder assemblies ("conduit assemblies"), at least a die 550 is placed active surface face down on tape 530. The "active surface" of die 550 is a surface of the die having bond pads 560 and 565.

It should further be noted that embodiments of the present invention do not depend on the exact nature of the component (e.g., die 550). The component can be, for example, integrated circuits, individual devices, filters, magnetostrictive devices, electro-optical devices, electro-acoustic devices, integrated passive devices such as resistors, capacitors and inductors, or other types of elements and combinations thereof, and can be formed of any materials able to withstand the encapsulation process. Non-limiting examples of materials are various organic and inorganic semiconductors, type IV, III-V and II-VI materials, glasses, ceramics, metals, semi-metals, inter-metallics and so forth.

Figure 6:
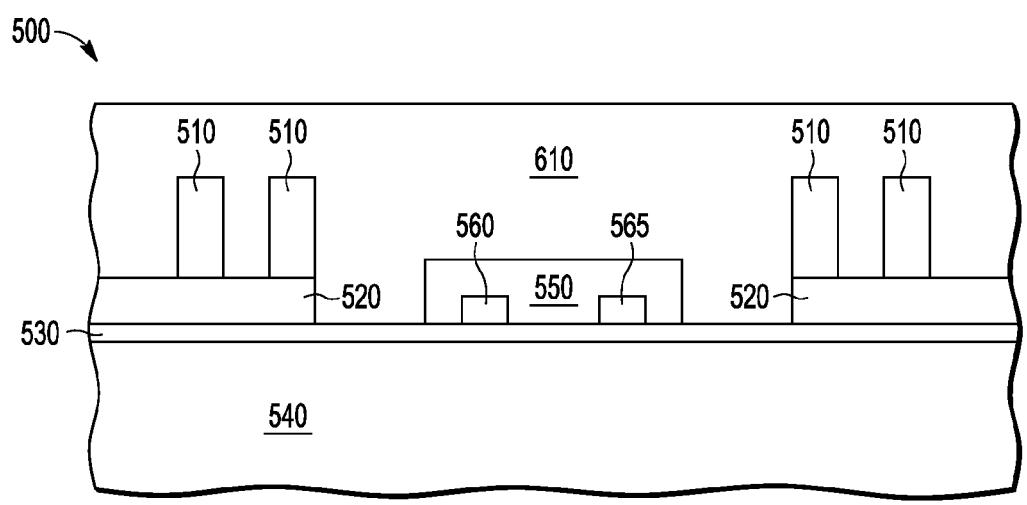
FIG. 6 is a simplified block diagram illustrating the cross sectional view of device structure at a later stage in the processing example.

FIG. 6 is a simplified block diagram illustrating the cross sectional view of device structure 500 at a later stage in the processing example. A molding material is applied to the structures affixed to tape 530 (e.g., signal conduits 510, lead frame 520, and die 550), forming an encapsulant 610 that encapsulates the structures within the molding material and forms a panel. The molding material can be any appropriate encapsulant including, for example, silica-filled epoxy molding compounds, plastic encapsulation resins, and other polymeric materials such as silicones, polyimides, phenolics, and polyurethanes. The molding material can be applied by a variety of standard processing techniques used in encapsulation including, for example, printing, pressure molding and spin application. Once the molding material is applied, the panel can be cured by exposing the materials to certain temperatures for a period of time, or by applying curing agents, or both. In a typical encapsulation process, a depth of encapsulant 610 can exceed a maximum height of structures embedded in the molding material (e.g., the height of signal conduits 510 as illustrated in FIG. 6).

Figure 7:
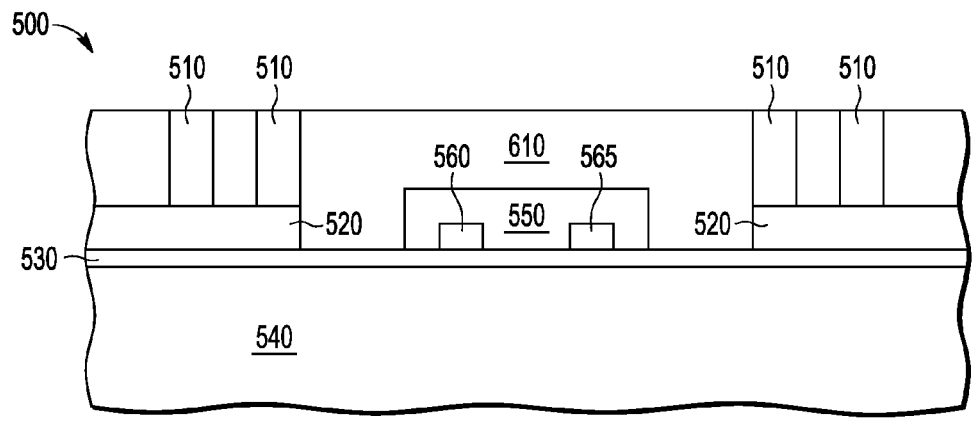
FIG. 7 is a simplified block diagram illustrating cross sectional view of a device structure at a later stage of processing, according to an embodiment of the present invention.

FIG. 7 is a simplified block diagram illustrating the cross sectional view of device structure 500 at a later stage in the processing example. Encapsulant 610 is reduced in thickness to expose the ends of signal conduits 510. This reduction in thickness of the encapsulant and exposing of the ends of the signal conduits can be performed by a grinding process, chemical etching, laser ablation, or other conventional techniques (e.g., back grinding), or alternatively by forming the encapsulant to the appropriate thickness during the encapsulation process.

Figure 8:
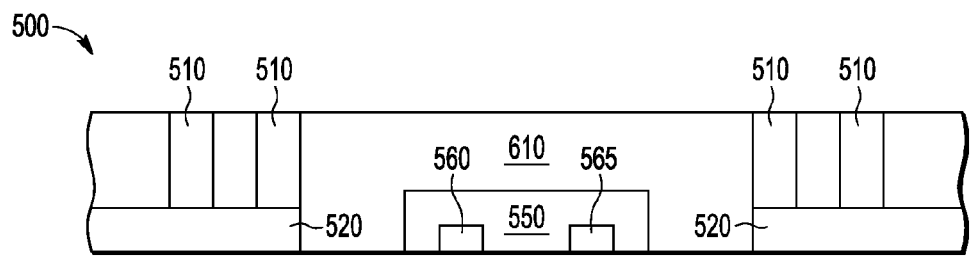
FIG. 8 is a simplified block diagram illustrating the cross sectional view of the device structure at a later stage of processing, according to an embodiment of the present invention.

FIG. 8 is a simplified block diagram illustrating the cross sectional view of device structure 500 at a later stage in the processing example. The encapsulated panel is removed from tape 530 (and carrier 540). Once released from the tape, the side of the panel previously attached to the tape can be cleaned to remove any excess adhesive remaining attached to the encapsulated panel. This process of tape release and clean exposes all of the contacts on the bottom side of the panel, including the bottom of lead frame 520 and bond pads 560 and 565. At this point, it can be seen that signal conduits 510 form conductive vias between the top of the encapsulated panel to the lead frame. These through vias can be used, for example, to enable electrical connection between interconnect structures or pads formed on the bottom and top of packages formed from the panel.

As an alternative, after tape release, a grind operation (e.g., backgrind) can be performed to remove all or portions of lead frame 520. Lead frame removal in this manner will electrically separate signal conduits 510 from one another prior to singulation of the panel.

Figure 9:
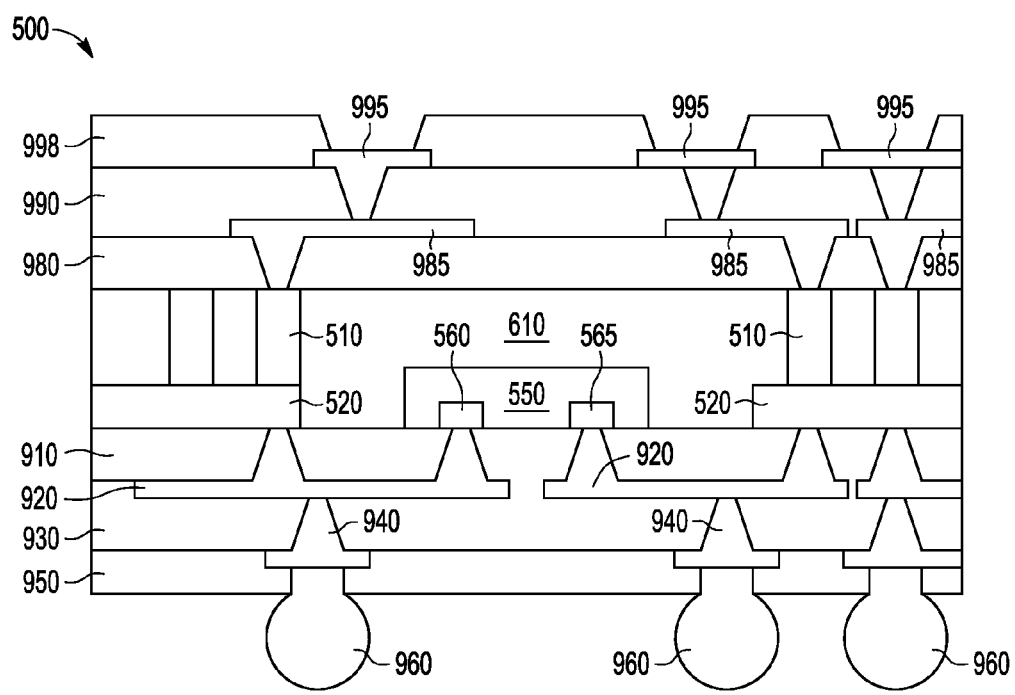
FIG. 9 is a simplified block diagram illustrating the cross sectional view of device structure after buildup, ball placement and singulation processing.

FIG. 9 is a simplified block diagram illustrating the cross sectional view of device structure 500 after buildup, ball placement and singulation. Processing providing the various layers illustrated in FIG. 9 can be provided by standard techniques used in semiconductor packaging.

An insulating layer 910 can be deposited over the bottom surface of the encapsulated die, lead frame, signal conduits and encapsulation molding material. Insulating layer 910 can be made from organic polymers, for example, in liquid or dry film and can include a wide range of other materials used for interlayer dielectrics as known in the art (e.g., silicon dioxide, silicon nitride, silicon oxynitride, or any combination of such layers providing electrical isolation). Insulating layer 910 can be patterned to expose bond pads 560 and 565, as well as the leads created by lead frame 520 (joined to through vias formed by signal conduits 510.

A conductive layer 920 can then be deposited to provide an interconnect between the bonding pads and leads. Conductive layer 920 can include materials such as metal, metal alloy, doped semiconductor, semi-metals, or combinations thereof as known in the art (e.g., amorphous silicon, doped polysilicon, aluminum, copper, tantalum, titanium, tungsten, or any metal alloy, nitride or silicide). Through the use of a conductive layer, any number of bonding pads can be interconnected in any combination to the same or other die and to the leads coupled to vias formed by electrically conductive signal conduits 510. The interconnect illustrated in FIG. 9 is provided only by way of example, and it should be realized that the interconnects formed by conductive layer 920 and other conductive layers discussed below can extend not only across the page as illustrated but also into and above the page.

An additional interconnect layer can be provided by forming additional insulating layers (e.g. insulating layer 930) and patterning those insulating layers to receive additional conductive layers (e.g., conductive layer 940). The range of materials that can be used for subsequent insulating layers and conductive layers can include those listed for insulating layer 910 and conductive layer 920, and each type of layer can be the same or different materials as required by the nature of the application. Further, as illustrated, a set of conductive ball connectors can be provided by forming insulating layer 950, patterning that layer to expose pads formed in conductive layer 940, and forming and placing conductive balls 960 using standard techniques and materials.

FIG. 9 illustrates a double-sided semiconductor package, in which an interconnect is provided on the top side of the package. Vias formed by electrically conductive signal conduits 510 allow for connections to be made between the bottom side interconnect and the top side interconnect. Again, the top side interconnect can be formed by standard techniques. For example, an insulating layer 980 can be formed over the top side surface of the signal conduits and encapsulation molding material. The insulating layer can be patterned to expose the top end of the vias formed by signal conduits 510. A conductive layer 985 can then be used to form an interconnect, which can be patterned and etched as required by the application. Subsequent insulating layers (e.g. insulating layer 990) and conductive layers (e.g. conductive layer 995) can be formed as required by the application. An additional insulation layer 998 can be formed to define a pattern to receive components on the top side of the package.

After buildup of top and bottom side interconnects has been performed, individual semiconductor packages can be separated from the panel using a singulation process. During the singulation process the leads formed by lead frame 520 can be electrically isolated by cutting the frame (e.g., frame 110) away from the leads (e.g., leads 120).

Figure 10:
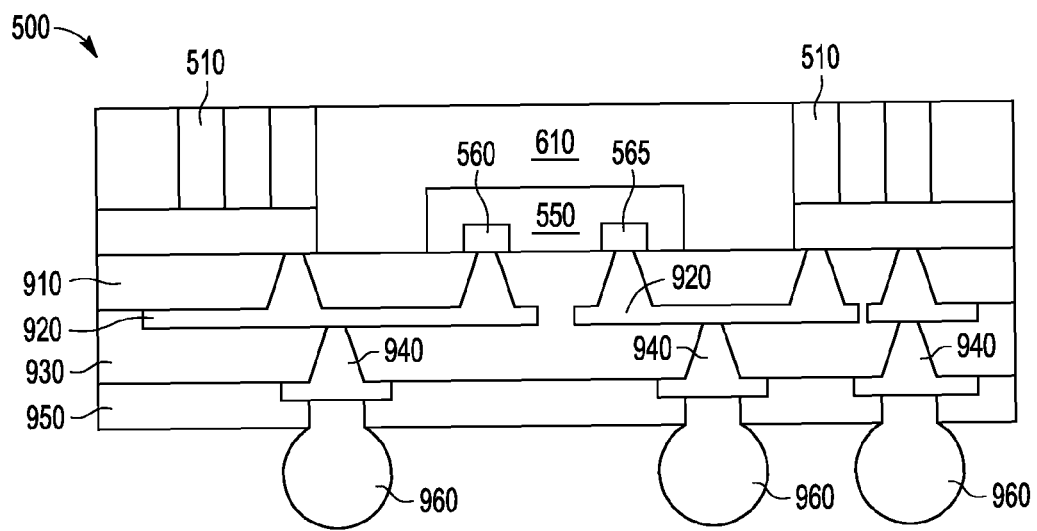
FIG. 10 is a simplified block diagram illustrating a cross sectional view of device structure 500 after buildup, ball placement and singulation according to an alternative embodiment having a single sided interconnection.

FIG. 10 is a simplified block diagram illustrating a cross sectional view of device structure 500 after buildup, ball placement and singulation according to an alternative embodiment having a single sided interconnection (e.g., a fan-out wafer level packaging structure). In this embodiment, an interconnect structure similar to that of FIG. 9 is built up over the bottom surface of the encapsulated die, signal conduits and encapsulation molding material. But no interconnect structure is built on the top surface. In such an embodiment, components can be directly attached to the top end of vias.

Figure 11:
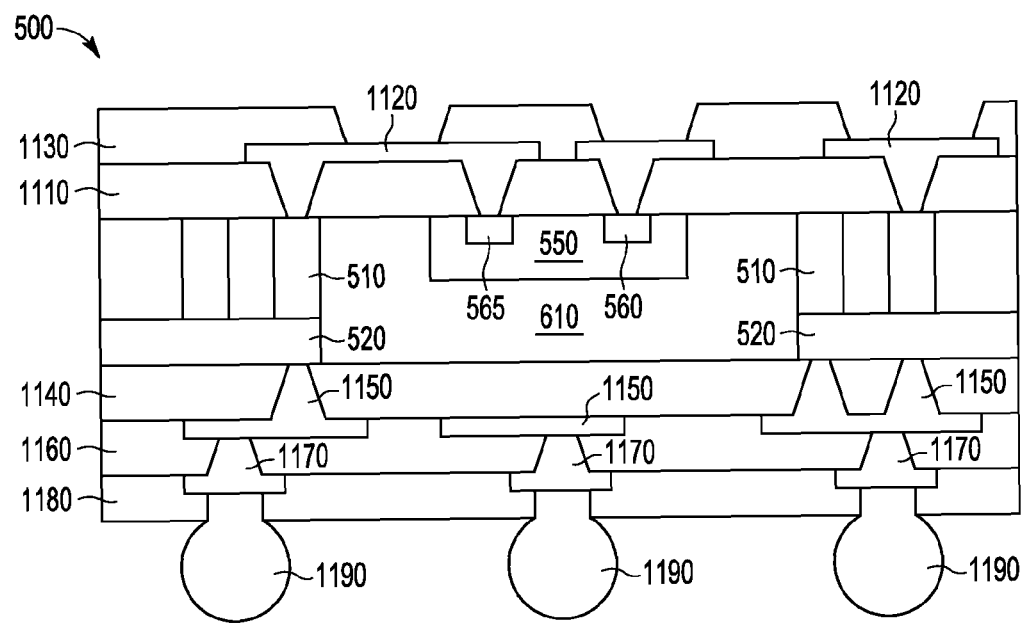
FIG. 11 is a simplified block diagram illustrating a cross sectional view of device structure after buildup, ball placement and singulation according to an alternative embodiment in which the conductive balls are attached to the interconnection structures at one side of the encapsulant and another side of package is used to receive the components.

FIG. 11 is a simplified block diagram illustrating a cross sectional view of device structure 500 after buildup, ball placement and singulation according to an alternative embodiment in which the conductive balls are attached to the interconnection structures at one side of the encapsulant and another side of package is used to receive the components. Processing providing the various layers in FIG. 11 can be provided by standard techniques used in semiconductor packaging.

An insulating layer 1110 can be deposited over the surface of the encapsulated die, signal conduits and encapsulation molding material. This surface is illustrated as the same surface as that corresponding to the bonding pads for the encapsulated die. Insulating layer 1110 can be formed from the same materials as described for insulating layer 910 above. Insulating layer 1110 can be patterned to expose bonding pads 560 and 565, as well as the ends of through package vias 510.

A conductive layer 1120 can be deposited over insulating layer 1110 to provide an interconnect between bonding pads and signal conduits. Conductive layer 1120 can be formed from the same materials used in conductive layer 920 above. An insulating layer 1130 can be formed and patterned over layer 1120 to define contacts for other components to be attached to device structure 500.

Another interconnect structure can be built on the other side of device structure 500. As illustrated, an insulating layer 1140 is formed and patterned so that a conductive layer 1150 can be formed to provide an interconnect between signal conduits and other contacts. A subsequent insulating layer 1160 can be formed and patterned to receive another conductive layer 1170. A set of conductive ball connectors can be provided by forming an insulating layer 1180 and forming and placing conductive balls 1190 using standard techniques and materials.

Embodiments of the present invention are not limited to the particular type of process illustrated in the figures. As shown, embodiments of the present invention are used in a fan-out wafer level package, (e.g. redistributed chip packaging process (RCP)), but embodiments of the present invention are not limited to fan-out wafer level package. For example, through vias formed by the drop-in signal conduits of the present invention can be incorporated in wire bonded processes such as QFN, leaded packages, and BGA, as well as flip chip processes. It should be realized, however, that steps discussed above may require modification for different types of processes. For example, leaded packages may not structurally permit a backside grind to expose the conduits, and therefore alternative processes will be used (e.g., laser ablation). In addition, the drop-in signal conduits may need to be attached to lead frames using techniques such as solder reflow and the like.

The signal conduits and lead frame of the present invention allow for pre-placement of through vias prior to encapsulation. Conduits and lead frame can be formed in a manner that allows for them to be placed before or during a pick and place process. Other components, such as die, can be placed at a later stage or at the same time. This allows for great flexibility in through via placement. The conduit assembly could be also pre-arranged in a group form (e.g., a repeating sequence of conduits in the lead frame). The group can be attached onto the tape at same time before the pick and place process. The signal conduits with lead frame are embedded in the package during the encapsulation process. The signal conduits are then exposed during standard back grinding of the encapsulant or can be exposed using alternate methods such as laser ablation. Subsequent buildup of the encapsulated device can use the signal conduits as through package connections (e.g. through vias).

The processes of the present invention save the need for post-encapsulation via drilling and filling steps. Incorporation of the through vias occurs at the same stage in processing as other pick and place operations, or before pick and place. Further, the process provides consistent quality signal paths through the depth of the package that do not depend upon a quality of a fill operation.

By now it should be appreciated that a method for packaging an electronic device assembly is disclosed which includes providing a lead frame assembly having a lead frame and one or more signal conduits attached to the lead frame, placing the lead frame assembly in a first area of the electronic device assembly, placing an electronic device in a second area of the electronic device assembly, forming an encapsulant over and around sides of the electronic device and over and around sides of the lead frame assembly, and exposing an end of a signal conduit. Each of the one or more signal conduits is coupled at a first end to a corresponding lead of the lead frame and the second end of the exposed signal conduit is that which is exposed. Further, the second area in which the first electronic device is placed is within a perimeter defined by the lead frame assembly.

One aspect of the above embodiment includes assembling the lead frame assembly by providing the lead frame, forming a photoresist layer on the lead frame, forming openings in the photoresist layer where signal conduits are desired, depositing a conductive material in the openings, and stripping the photoresist layer from the lead frame. Another aspect of the above embodiment includes assembling the lead frame assembly by providing the lead frame, forming one or more inner leads, and bending at least a portion of a lead of the one or more inner leads to form approximately a right angle to the plane of the lead frame after bending. In this aspect, forming the one or more inner leads includes one of etching the lead frame or stamping the lead frame.

Another aspect of the above embodiment includes assembling the lead frame assembly by providing a lead frame blank, performing a first etch to form the one or more signal conduits in desired locations, and performing a second etch to form the leads from the lead frame blank. Still another aspect of the above embodiment includes assembling the lead frame assembly by providing the lead frame, forming one or more inner leads, forming one of a hole or depression configured to receive a signal conduit of the one or more signal conduits, and pressing the signal conduit into the hole or depression, thereby mechanically locking the signal conduit into the hole or depression.

One aspect of the above embodiment provides for removing a portion of the encapsulant from the electronic device assembly to perform the exposing of the second end of the signal conduit. In a further aspect, removing the portion of the encapsulant includes one of grinding the encapsulant to a depth matching the end of the signal conduit or laser ablating the encapsulant to a depth matching the end of the signal conduit. In another further aspect, exposing the second end of the signal conduit is performed by forming the encapsulant such that the ends of the signal conduit are exposed.

In another aspect of the above embodiment, the second end of the signal conduit has a structure that includes one or more of a solder ball, a gold stud bump, or any copper stud bump.

Another aspect of the above embodiment includes separating the electronic device assembly from one or more other electronic device assemblies in which the method for packaging forms a panel of electronic device assemblies. In this aspect, the separating includes cutting at least a portion of the lead frame from the electronic device assembly, which electrically isolates one or more signal conduits and associated leads from one or more other signal conduits and associated leads.

Yet another aspect of the above embodiment includes providing a double sided adhesive tape disposed on the carrier so that placing of the lead frame assembly includes placing the lead frame assembly on the tape with a side down that is not in contact with the signal conduits, exposing the side of the lead frame that is not in contact with the signal conduits after forming the encapsulant, forming a first interconnect structure on a first side of the electronic device assembly wherein the first interconnect structure couples a first contact on the first electronic device to a portion of the lead frame attached to a signal conduit, and forming, after exposing the second end of the signal conduit, a second interconnect structure on a second side of the electronic device assembly in which the second interconnect structure is coupled to the signal conduit.

Another aspect of the above embodiment includes coupling a first contact of the first electronic device to a portion of the lead frame attached to a signal conduit, wherein the coupling is performed using one of a wire bond or a flip chip.

In another embodiment, a packaged device assembly is provided that includes an electronic device, one or more conductive vias extending from a top surface of the packaged device assembly to corresponding leads at a bottom surface of the packaged device assembly, and encapsulant over and around the electronic device and around the conductive vias and forming an encapsulated region of the packaged device assembly, wherein the one or more conductive vias are formed using corresponding signal conduits and each signal conduit is formed before encapsulating the electronic device and signal conduits. In one aspect of this embodiment, the package device assembly also includes a lead frame assembly that includes a lead frame and the one or more signal conduits attached to the lead frame wherein the one or more signal conduits are aligned to each other signal conduit, if any, and each signal conduit has a length equal to a thickness of the encapsulated region. In another aspect of this embodiment the conductive vias are formed from one of copper, aluminum, tantalum, titanium, tungsten, or any metal alloy.

Another embodiment provides a method for packaging an electronic device assembly in which the method includes forming a lead frame and coupling one or more signal conduits to corresponding leads of the lead frame such that the forming and coupling provide a lead frame assembly, placing the lead frame assembly in a first area for the electronic device assembly, and forming an encapsulant over and around sides of the lead frame assembly. A signal conduit of the one or more signal conduits forms a conductive via through the encapsulated electronic device assembly.

In one aspect of the above embodiment, coupling the one or more signal conduits to corresponding leads of the lead frame includes forming a photoresist layer on the lead frame, patterning the photoresist layer to provide a hole from the top of the photoresist layer to a contact position of the lead frame, forming a conductive layer in the photoresist hole and contacting the contact position, and removing the photoresist layer from the lead frame. In a further aspect, forming the lead frame includes etching frame material to form the leads of the lead frame. In another aspect of the above embodiment, coupling the one or more signal conduits to corresponding leads of a lead frame includes providing a lead frame blank, and selectively etching the lead frame blank to form a frame of the lead frame, the leads of the lead frame, and the one or more signal conduits.

Because the apparatus implementing the present invention is, for the most part, composed of electronic components and circuits known to those skilled in the art, circuit details are not explained in any greater extent than that considered necessary as illustrated above, for the understanding and appreciation of the underlying concepts of the present invention and in order not to obfuscate or distract from the teachings of the present invention.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for packaging an electronic device assembly, the method comprising:
  providing a lead frame assembly comprising a lead frame and one or more signal conduits attached to the lead frame, wherein
    each of the one or more signal conduits is coupled at a first end to a corresponding lead of the lead frame, and
    the first end of each signal conduit is coupled to a free end of the corresponding lead;
  placing the lead frame assembly in a first area for the electronic device assembly;
  placing a first electronic device in a second area for the electronic device assembly,
    wherein the second area is within a perimeter defined by the lead frame assembly;

forming an encapsulant over and around sides of the first electronic device and over and around sides of the lead frame assembly; and exposing a second end of a signal conduit of the one or more signal conduits, wherein the signal conduit forms a conductive via through the encapsulated electronic device assembly.

2. The method of claim 1 further comprising:
assembling the lead frame assembly, wherein said assembling comprises
providing the lead frame,
forming a photoresist layer on the lead frame,
forming openings in the photoresist layer where signal conduits are desired,
depositing a conductive material in the openings in the photoresist layer, and
stripping the photoresist layer from the lead frame.

3. The method of claim 1 further comprising:
assembling the lead frame assembly, wherein said assembling comprises
providing the lead frame,
forming one or more inner leads, and
bending at least a portion of a lead of the one or more inner leads, wherein the at least the portion of the lead forms approximately a right angle to the plane of the lead frame subsequent to said bending.

4. The method of claim 3 wherein said forming the one or more inner leads comprises one of etching the lead frame or stamping the lead frame.

5. The method of claim 1 further comprising:
assembling the lead frame assembly, wherein said assembling comprises
providing a lead frame blank,
performing a first etch to form the one or more signal conduits in desired locations, and
performing a second etch to form leads from the lead frame blank.

6. The method of claim 1 further comprising:
assembling the lead frame assembly, wherein said assembling comprises
providing the lead frame,
forming one or more inner leads,
forming one of a hole or depression on one of the one or more inner leads, wherein the hole or depression is configured to receive a signal conduit of the one or more signal conduits, and
pressing the signal conduit into the hole or depression, wherein the signal conduit is mechanically locked into the hole or depression.

7. The method of claim 1 wherein said exposing further comprises removing a portion of the encapsulant from the electronic device assembly.

8. The method of claim 7 wherein said removing further comprises one of:
grinding the encapsulant from the electronic device assembly to a depth matching the end of the signal conduit; and
laser ablating the encapsulant from the electronic device assembly to a depth matching the end of the signal conduit.

9. The method of claim 7 wherein said exposing further comprises performing said forming the encapsulant exposes the ends of the conduit without removing a portion of the encapsulant.

10. The method of claim 1 wherein the second end of the signal conduit comprises a structure comprising one or more of a solder ball, a gold stud bump, and a copper stud bump.

11. The method of claim 1 further comprising:
separating the electronic device assembly from one or more other electronic device assemblies, wherein
the method for packaging forms a panel of electronic device assemblies,
said separating comprises cutting at least a portion of the lead frame from the electronic device assembly, and
said cutting electrically isolates one or more signal conduits and associated leads from one or more other signal conduits and associated leads.

12. The method of claim 1 further comprising:
providing a double-sided adhesive tape disposed on a carrier, wherein said placing the lead frame assembly comprises placing the lead frame assembly on the tape with a side down that is not in contact with the signal conduits;
exposing the side of the lead frame assembly that is not in contact with the signal conduits, after said forming the encapsulant;
forming, after said exposing the side of the lead frame assembly, a first interconnect structure on a first side of the electronic device assembly, wherein the first interconnect structure couples a first contact on the first electronic device to a portion of the lead frame attached to a signal conduit; and
forming, after said exposing the second end of the signal conduit, a second interconnect structure on a second side of the electronic device assembly, wherein the second interconnect structure is coupled to the signal conduit.

13. The method of claim 1 further comprising:
coupling a first contact of the first electronic device to a portion of the lead frame attached to a signal conduit, wherein said coupling is performed using one of a wire bond or a flip chip.

14. A method for packaging an electronic device assembly, the method comprising:
forming a lead frame;
coupling one or more signal conduits to corresponding leads of the lead frame, wherein said forming and coupling provides a lead frame assembly, and
a first end of each signal conduit of the one or more signal conduits is coupled to a free end of a corresponding lead of the lead frame;
placing the lead frame assembly in a first area for the electronic device assembly;
forming an encapsulant over and around sides of the lead frame assembly, wherein
a signal conduit of the one or more signal conduits forms a conductive via through the encapsulated electronic device assembly.

15. The method of claim 14 wherein said coupling the one or more signal conduits to corresponding leads of the lead frame comprises:
forming a photoresist layer on the lead frame;
patterning the photoresist layer to provide a hole from the top of the photoresist layer to a contact position of the lead frame;
forming a conductive layer in the photoresist hole and contacting the contact position; and
removing the photoresist layer from the lead frame.

16. The method of claim 15 wherein said forming the lead frame comprises: etching frame material to form the leads of the lead frame.

17. The method of claim 14 wherein said coupling the one or more signal conduits to corresponding leads of the lead frame comprises:
  providing a lead frame blank; and
  selectively etching the lead frame blank to form a frame of the lead frame, the leads of the lead frame, and the one or more signal conduits.

* * * * *